(12) United States Patent
Patel et al.

(10) Patent No.: US 8,014,430 B2
(45) Date of Patent: Sep. 6, 2011

(54) QUANTUM CASCADE LASER

(75) Inventors: C. Kumar N. Patel, Los Angeles, CA (US); Alexei Tsekoun, Los Angeles, CA (US); Richard Maulini, Los Angeles, CA (US); Arkadiy Lyakh, Los Angeles, CA (US); Christian Pflugl, Cambridge, MA (US); Laurent Diehl, Cambridge, MA (US); Qijie Wang, Cambridge, MA (US); Federico Capasso, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 351 days.

(21) Appl. No.: 12/395,576

(22) Filed: Feb. 27, 2009

(65) Prior Publication Data

US 2009/0213890 A1 Aug. 27, 2009

Related U.S. Application Data

(60) Provisional application No. 61/064,289, filed on Feb. 27, 2008.

(51) Int. Cl.
*H01S 5/00* (2006.01)
(52) U.S. Cl. ................... 372/45.012; 372/44.01
(58) Field of Classification Search ............. 372/44.01, 372/45.012
See application file for complete search history.

(56) References Cited

U.S. PATENT DOCUMENTS

| 6,137,817 | A * | 10/2000 | Baillargeon et al. ....... 372/45.01 |
| 2005/0036530 | A1* | 2/2005 | Schneider et al. ............. 372/46 |
| 2006/0215718 | A1* | 9/2006 | Yasuda et al. ............ 372/45.012 |
| 2007/0104238 | A1* | 5/2007 | Hu et al. ..................... 372/43.01 |
| 2008/0069164 | A1* | 3/2008 | Edamura et al. ......... 372/45.012 |
| 2008/0219308 | A1* | 9/2008 | Yamanishi et al. ........ 372/44.01 |
| 2008/0273565 | A1* | 11/2008 | Gmachl et al. .......... 372/45.012 |

OTHER PUBLICATIONS

J. Faist et al., Quantum Cascade Laser, Science, vol. 264, pp. 553-556, Apr. 22, 1994.
D. Hofstetter et al., Continuous Wave Operation of a 9.3 µm Quantum Cascade Laser on a Peltier Cooler, Applied Physics Letters, vol. 78, pp. 1964-1966, 2001.

(Continued)

*Primary Examiner* — Jessica Stultz
*Assistant Examiner* — Yuanda Zhang
(74) *Attorney, Agent, or Firm* — Cislo & Thomas, LLP

(57) ABSTRACT

A quantum cascade laser utilizing non-resonant extraction design having a multilayered semiconductor with a single type of carrier; at least two final levels (1 and 1') for a transition down from level 2; an energy spacing $E_{21}$ greater than $E_{LO}$; an energy spacing $E_{31}$ of about 100 meV; and an energy spacing $E_{32}$ about equal to $E_{LO}$. The carrier wave function for level 1 overlaps with the carrier wave function for level 2. Likewise, the carrier wave function for level 1' overlaps with the carrier wave function for level 2. In a second version, the basic design also has an energy spacing $E_{54}$ of about 90 meV, and levels 1 and 1' do not have to be spatially close to each other, provided that level 2 has significant overlap with both these levels. In a third version, there are at least three final levels (1, 1', and 1") for a transition down from level 2. Each of the levels 1, 1', and 1" has a non-uniform squared wave function distribution.

25 Claims, 11 Drawing Sheets

OTHER PUBLICATIONS

A. Lyakh et al., 1.6 Watt, High Wallplug Efficiency, Continuous-Wave Room Temperature QuantumCascade Laser Emmiting at 4.6 mm, Applied Physics Letters 92, 111110, 2008.

J. Tavish et al., Aspects of the Internal Physics of InGaAs/InAlAs Quantum Cascade Laser, Journal of Applied Physics 99114505, 2006.

J. Faist et al., Quantum-Cascade Lasers, Semiconductors, vol. 66, Edited by H. C. Liu and F. Capasso, Academic, New York, pp. 1-83, 2000.

J. Faist et al., Bound-to-Continuum . . . , IEEE Journal of Quantum Electronics, vol. 38, No. 6, pp. 533-546, 2002.

J. Faist et al., Quantum-Cascade lasers Based on Bound-to-Continuum Transition, Applied Physics Letters, vol. 78, pp. 147-149, 2001.

K. Fujita, Room Temperature, Continuous-Wave Operation of Quantum Cascade Lasers . . . , Applied Physics Letters 91, 141121, 2007.

* cited by examiner

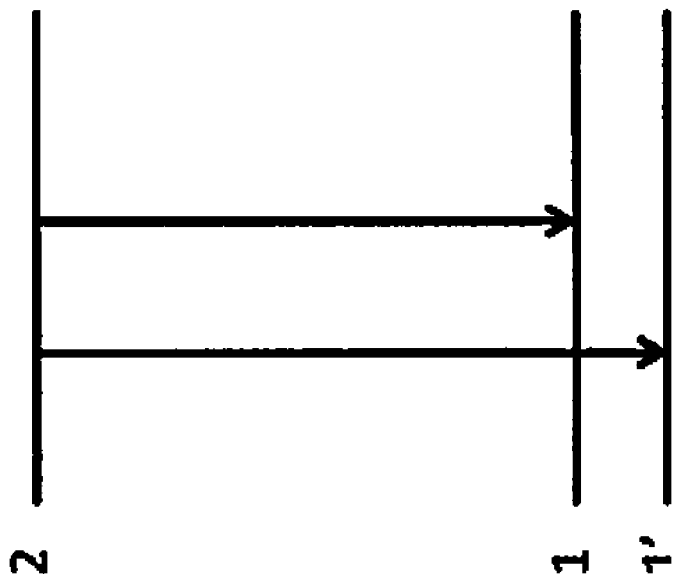
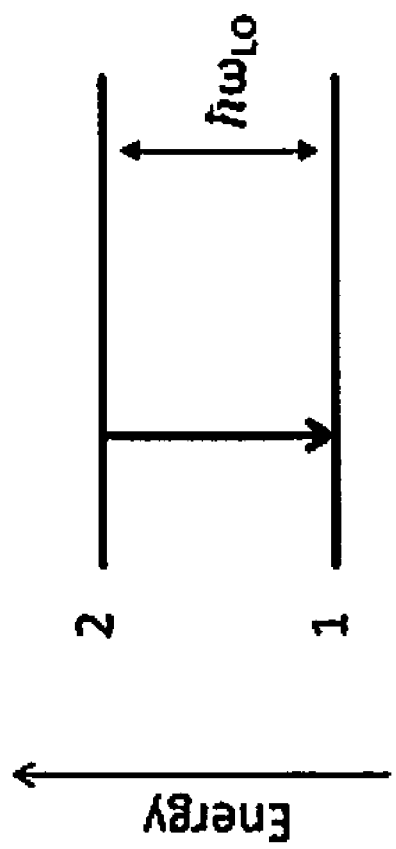
FIG. 4 (a)
FIG. 4 (b)

QUANTUM CASCADE LASER

CROSS-REFERENCES TO RELATED APPLICATIONS

This patent application claims the benefit of U.S. Provisional Patent Application Ser. No. 61/064,289 filed Feb. 27, 2008 for Quantum Cascade Laser, which application is incorporated here by this reference.

TECHNICAL FIELD

This invention relates to quantum cascade lasers based on non-resonant extraction.

BACKGROUND ART

A quantum cascade laser (QCL) is a multilayer semiconductor laser, based only on one type of carriers (usually electrons). A schematic diagram of a typical QCL is shown in FIG. 1. It consists of multiple layers of $In_xGa_{1-x}As/Al_yIn_{1-y}As/InP$ having different compositions x and y, typically grown using molecular beam epitaxy (MBE) or metal-organic chemical vapor deposition (MOCVD) techniques. Electric current in these devices is injected along the x-axis, perpendicular to the grown layers. An insulator confines the current under the contact stripe, preventing it from spreading in the y-direction. When carriers reach the gain section, they emit photons through intersubband radiative transitions (see below). Waveguide and cladding layers confine emitted light around the gain region and direct it along the z-axis. A laser of this type is described in U.S. Pat. No. 5,457,709 and Faist et al., "Quantum Cascade Laser", Science, vol. 264, pp. 553-556, (Apr. 22, 1994).

The gain section of a QCL usually consists of twenty (20) to sixty (60) identical gain stages. A gain stage consists of approximately twenty (20) very thin $In_xGa_{1-x}As$ and $Al_yIn_{1-y}As$ layers (1-5 nm) with alternating bandgap values (quantum wells and barriers, respectively). Many alternative systems have also been demonstrated. A schematic of the conduction band diagram of one gain stage under an applied electric field is shown in FIG. 2. In an ideal case each carrier emits one photon in each gain stage.

As described in U.S. Pat. No. 5,457,709, the layers within the stage are usually divided into two regions: the active region and the energy relaxation region (injector). The active region is designed for light emission through carrier radiative intersubband transitions (transition from level 3 to level 2 in FIG. 2), while the energy relaxation region (injector) is used for energy relaxation of carriers before injection into the next stage.

Carrier population inversion between the upper and lower laser levels (levels 3 and 2 in FIG. 2), required for lasing, can be achieved when the upper laser level lifetime, $\tau_3$, is longer than the lower laser level lifetime, $\tau_2$. As claimed in U.S. Pat. No. 5,457,709, this condition is met when the energy spacing between levels 2 and 1 (annotated as $E_{21}$) is designed to be substantially equal to the energy of the longitudinal optical (LO) phonon (~35 meV in the case of InP-based QCLs). In this case $\tau_2$ and lower laser level population are reduced. This scheme is often called the single-phonon design.

QCL performance can be substantially improved by employing a so-called two-phonon resonance design (see, for example, U.S. Pat. No. 6,751,244) instead of the single-phonon resonance design described above. A schematic conduction band diagram for this design is shown in FIG. 3. The active region in this case is composed of at least four quantum well/barrier pairs instead of at least three for the single-phonon design. The lasing transition occurs between energy levels 4 and 3. Significantly, energy spacings $E_{32}$ and $E_{21}$ are both substantially equal to LO phonon energy, leading to short $\tau_3$ and $\tau_2$. Since energy spacing between the lower laser level and the lowest active region level $E_{31}$ (~70 meV) is increased by factor of two compared to $E_{21}$ in case of the single-phonon resonance design (~35 meV), the two-phonon resonance design has an advantage of reduced carrier population on the lower laser level 3 due to reduced carrier thermal backfilling for this state from the lowest active region state 1.

DISCLOSURE OF INVENTION

The aim of this invention is to improve laser types discussed in U.S. Pat. Nos. 5,457,709 and 6,751,244. Among many others, two processes important for good QCL performance are the efficient depopulation of the lower laser level 3 (FIG. 3) and efficient pumping of electrons into the upper laser level 4. Once the two-phonon condition is met (as in U.S. Pat. No. 5,457,709), there is not much leeway in design variations, and the separation between other levels, notably the separation between levels 5 and 4, is relatively fixed. As discussed below, the separation between levels 5 and 4 plays an important role by reducing the undesirable leakage of electrons from level 4 to level 5 through thermal excitation and subsequent loss to the continuum if the separation 5-4 is small. One way to increase the structure design flexibility is to remove the two phonon resonance condition, i.e. $E_{3-2}$ and $E_{2-1}$ both simultaneously being equal to $E_{LO}$, without sacrificing the short lower laser lifetime desirable for efficient QCL operation.

Carrier lifetime $\tau_i$ for an energy level i can be found to be, $$\frac{1}{\tau_i} = \sum_f \frac{1}{\tau_{if}} \qquad \text{(Equation 1)}$$

where $\tau_{if}$ is a carrier transition time from the energy level i to a final level f and the summation is done over all possible final states. Each carrier transition time $\tau_{ij}$ reaches its minimum when energy spacing $E_{if}$ is equal to the energy of the longitudinal optical phonon $E_{LO}$ (LO phonon assisted relaxation of the levels) and monotonically increases when $E_{if}$ increases above $E_{LO}$. As a consequence, $E_{21}$ (in the case of U.S. Pat. Nos. 5,457,709 and 6,751,244), as well as $E_{32}$ (in case of U.S. Pat. No. 6,751,244) are usually designed to be substantially equal to $E_{LO}$.

The present inventors have realized that the energy spacing $E_{21}$ can be substantially increased without increasing $\tau_2$ provided that there are at least two final levels 1 and 1' in FIG. 4(b), instead of one level 2 in FIG. 4(a), for a transition from level 2. Likewise, the inventors realized that the energy spacing $E_{32}$ can be substantially increased without increasing $\tau_3$ provided that there are at least two final levels 2 and 2', instead of one level 2, for a transition from level 3.

Significantly, carrier wave functions of these final states should have a significant overlap with the wave function of the level 2 for the $E_{21}$ case and of the level 3 for the $E_{32}$ case. In this case, the summation over several final states in Equation 1, instead of one, compensates for the increase in transition times to individual final states due to increase in transition energies, and leads to lifetimes of lower states substantially similar to those achieved in U.S. Pat. Nos. 5,457,709 and 6,751,244.

Since increased energy spacing(s) entails reduced carrier population of the lower laser level (due to reduced thermal backfilling), an improved laser performance is expected. Quantum cascade lasers based on this alternative relaxation mechanism may lead to many other variations. For example, they can also be realized employing GaAs-based or Si/Ge-based compositions. We designate this design approach "non-resonant extraction" or NRE.

A First, Basic Embodiment of an Improved QCL

The schematic of the basic NRE design of the present invention is shown in FIG. 5(a). A conduction band diagram representing two gain stages of the first of the embodiments of an improved laser, based on the non-resonant extraction (NRE) approach described above, is shown in FIG. 5(b). The active region of our structure is based on highly strained (~1%) $In_{0.67}Ga_{0.33}As/Al_{0.64}In_{0.36}As$ quantum wells/barriers with strain compensation in each stage. The laser transition energy $E_{43}$, the laser transition matrix element $z_{43}$, and the upper laser level lifetime $\tau_4$ were calculated to be 275 meV ($\lambda$=4.5 μm), 1.48 nm, and 1.77 ps, respectively. To reduce electron thermal backfilling of the lower laser level 3, the energy spacing $E_{31}$ was designed to be approximately 100 meV. As with the traditional two phonon resonance design, the energy spacing $E_{32}$ in our design was equal to the energy of the longitudinal optical phonon (34 meV). However, in contrast to a two-phonon design, $E_{21}$ was designed to be approximately 70 meV. The phonon-limited lifetimes $\tau_3$ and $\tau_2$ were calculated to be 0.26 and 0.34 ps, respectively, which are close to typical values for the two-phonon design. A very crucial outcome of our design is that the large value of energy spacing $E_{21}$ does not lead to a longer electron lifetime $\tau_2$ because the proposed design has two, instead of one, closely spaced (18 meV) lowest active region states 1 and 1', both having large overlaps with state 2.

Continuous wave (CW) optical power and voltage vs. current characteristics (LIVs) for a 5 mm long laser with uncoated facets (having the active region design shown in FIGS. 5(a) and 5(b)) and 9.5 μm stripe width are shown in FIG. 6, along with wall plug efficiency (WPE), defined as the total optical power output divided by the electrical power input to the QCL. The maximum total optical power (including both facets) was measured to be 1.6 W at 300K, the highest value reported as of January 2008 for a single QCL in CW mode at room temperature. After a correction for the measurement setup wiring resistance equal to 0.26 ohm, maximum WPE was found to be 8.8%. In addition, the CW threshold current density was measured to be 1.05 kA/cm².

The record high optical power, very high wall plug efficiency and low threshold current density demonstrate that QCLs utilizing the proposed alternative relaxation mechanism have at least as good or better performance as lasers based on the other designs. In addition to improved laser characteristics, the new approach allows for greater flexibility in designing the quantum levels since $E_{21}$ (and/or $E_{32}$) does not have to be substantially equal to LO phonon energy. As a consequence, a higher level of optimization can be achieved for structures based on this approach.

"Large $E_{54}$" Design

We used the design flexibility of the NRE approach to increase energy spacing $E_{54}$ between the upper laser level 4 and the active region level 5 above it. Larger $E_{54}$ leads to higher carrier injection efficiency from the lowest injector level to the upper laser level 4 due to suppressed carrier leakage through level 5. Both the laser threshold current and slope efficiency improve (i.e., threshold current decreases and the slope efficiency increases) with an increase in the upper laser level injection efficiency.

One of the design challenges in this case is that an increase in $E_{54}$ should be achieved while preserving vertical laser transition; that is, the average wave function coordinates for the both laser levels should be close to each other. When these coordinates are significantly separated, the laser transition becomes diagonal with a disadvantage of lower matrix element and larger line width. Generally, this leads to lower device performance. In addition, the final design should have a good coupling between the active region and the injector. An increase in $E_{54}$ while keeping the laser transition vertical may require an increase in extraction barrier thickness, which, in its turn, reduces active region/injector coupling (increases tunneling time from the active region to the injector). Poor coupling leads to a reduction in the maximum current density (at the same doping level) of the laser and, as a consequence, lower dynamic range, maximum power, and WPE.

The design restrictions discussed above make the two-phonon approach ineffective since it adds resonance restriction $E_{32}$=$E_{21}$=LO phonon energy. As shown in FIGS. 7(a) and 7(b), NRE design flexibility allowed us to increase $E_{54}$ up to about 90 meV, compared to about 60 meV for the basic NRE structure shown in FIGS. 5(a) and 5(b), while keeping vertical the radiative transition from level 4 to level 3. (Levels 4 and 3 are mostly localized in the same two quantum wells.) As with the first structure, the laser transition energy $E_{43}$, the laser transition matrix element $z_{43}$, and the upper laser level lifetime $\tau_4$ were calculated to be 277 meV, 1.40 nm, and 1.78 ps, respectively. Also, as with the first NRE structure, $E_{32}$ was close to LO phonon energy (~35 meV), but $E_{21}$ and $E_{21'}$ significantly deviated from it and were above 60 and 50 meV, respectively. The phonon-limited lifetimes $\tau_3$ and $\tau_2$ were calculated to be 0.3 and 0.35 ps, respectively.

It is important to mention that realization of "Large $E_{54}$" structure was different compared to the first NRE design. Specifically, all energy levels (2, 1, and 1') involved in the parallel transition in the first NRE design are localized in the active region. In contrast, in "Large $E_{54}$" design, level 2 has a large overlap both with the active region and injector, while levels 1 and 1' are localized in the active region and injector, respectively. This shows that levels 1 and 1' do not have to be spatially close to each other, provided that level 2 has significant overlap with both these levels.

Maximum current density for the "Large $E_{54}$" structure was found to be 2.8 kA/cm², which is close to 3.3 kA/cm² measured for the first NRE structure. (Both structures were doped to have the same carrier sheet density.) This comparison indicates that good active region/injector coupling for the "Large $E_{54}$" structure was preserved despite significant design changes required to increase $E_{54}$. The maximum power in CW at room temperature for an HR-coated, 5 mm by 10 μm laser processed from this structure was ~2.1 W, which, to our knowledge is the highest single-facet emission value for all QCLs.

Vertical-Transition, Fast-Extraction Design

The Vertical-Transition, Fast-Extraction (VTFE) design presented in FIGS. 8(a) and 8(b) is another illustration that the NRE approach is a very efficient tool for design optimization. As discussed above, vertical laser transition has an advantage of a higher matrix element and lower linewidth compared to diagonal transition. However, in current designs it is usually achieved at the expense of relatively low active region/injector coupling, when active region and injector wave functions do not have appreciable spatial overlap between each other. As a consequence, transport across the structure is slowed by carrier tunneling from the active region to the injector.

In a bound-to-continuum (BTC) design, described in U.S. Pat. No. 6,922,427 and Faist et al., "Quantum-Cascade lasers Based on Bound-to-Continuum transition", *Applied Physics Letters*, vol. 78, p. 147-149 (2001), lower laser levels wave functions (usually, there are two for a BTC design) and the ones below them are delocalized, spanning over the whole QCL unit stage with roughly uniform squared wave function $\psi^2$ distribution. As a consequence, transport across the structure is faster (no tunneling from the active region to the injector). However, since the lower laser level wave functions are delocalized, the laser transition is diagonal.

One way to combine vertical transition and delocalized extraction is to delocalize active region wave functions located below the lower laser level, while keeping the lower laser level in the active region. This approach was used in Fujita et al., "Room Temperature, Continuous-Wave Operation of Quantum Cascade Lasers With Single Phonon Resonance-Continuum Depopulation structures Grown by Metal Organic Vapor-Phase Epitaxy", *Applied Physics Letters* vol. 91, p. 141121 (2007), where the radiative transition from level 4 to level 3 was followed by electron relaxation from the level 3 to a miniband of delocalized wave function, separated from the level 3 by LO phonon energy. This approach has a disadvantage that such wave functions alignment, with very strong active region/injector coupling and localized upper laser level, can be achieved only in a narrow window of quantum wells/barriers. As a consequence, small fluctuations in thickness, characteristic to any epi-layer growth, can easily lead to delocalization of the lower laser level 3.

With the NRE approach, both vertical transition and fast extraction can be achieved without delocalization of the states located below the level 3 (that is, without very strong active region/injector coupling). As shown in FIG. 8(*b*), in our VTFE design the laser transition is vertical (the levels 4 and 3 are mostly localized in the same two quantum wells), with a large matrix element of 1.68 nm. Energy spacing between the levels 3 and 2 is equal to LO phonon energy, leading to the lower laser level lifetime of 0.3 ps. After the level 3 to level 2 transition, electrons can relax from the level 2 through three parallel non-resonant LO phonon transitions to levels 1, 1' and 1". As a consequence, $\tau_2$ was found to be only 0.35 ps, despite the fact that, as with the previous two structures, energy for each of these transitions was significantly above LO phonon energy. As shown in FIG. 8(*b*), levels 1 and 1' have a large overlap both with the active region and injector. As a consequence, transport for this design is not slowed down by a long active region/injector tunneling time. However, in contrast to Fujita et al., supra, and the BTC approach, levels 1, 1' and 1" are not delocalized (do not span through the whole stage with uniformly distributed $\psi^2$). Therefore, vertical laser transition can be achieved without restriction of a very strong coupling between the active region and injector. This makes out VTFE design less sensitive to quantum wells/barriers thickness fluctuation.

BRIEF DESCRIPTION OF DRAWINGS

FIG. 4(*a*) depicts a resonance LO phonon-assisted relaxation used in two-phonon and single-phonon designs.

FIG. 4(*b*) depicts a relaxation with at least two, instead of one, final states, according to the basic NRE version of the present invention.

FIG. 5(*b*) is a conduction band diagram of two successive gain stages of the basic NRE version of the present invention.

FIG. 7(*b*) is a conduction band diagram of two successive gain stages of the Large $E_{54}$ design version of the present invention.

FIG. 8(*b*) is a conduction band diagram of two successive gain stages of the VTFE design version of the present invention.

BEST MODE FOR CARRYING OUT THE INVENTION

Figure 1:
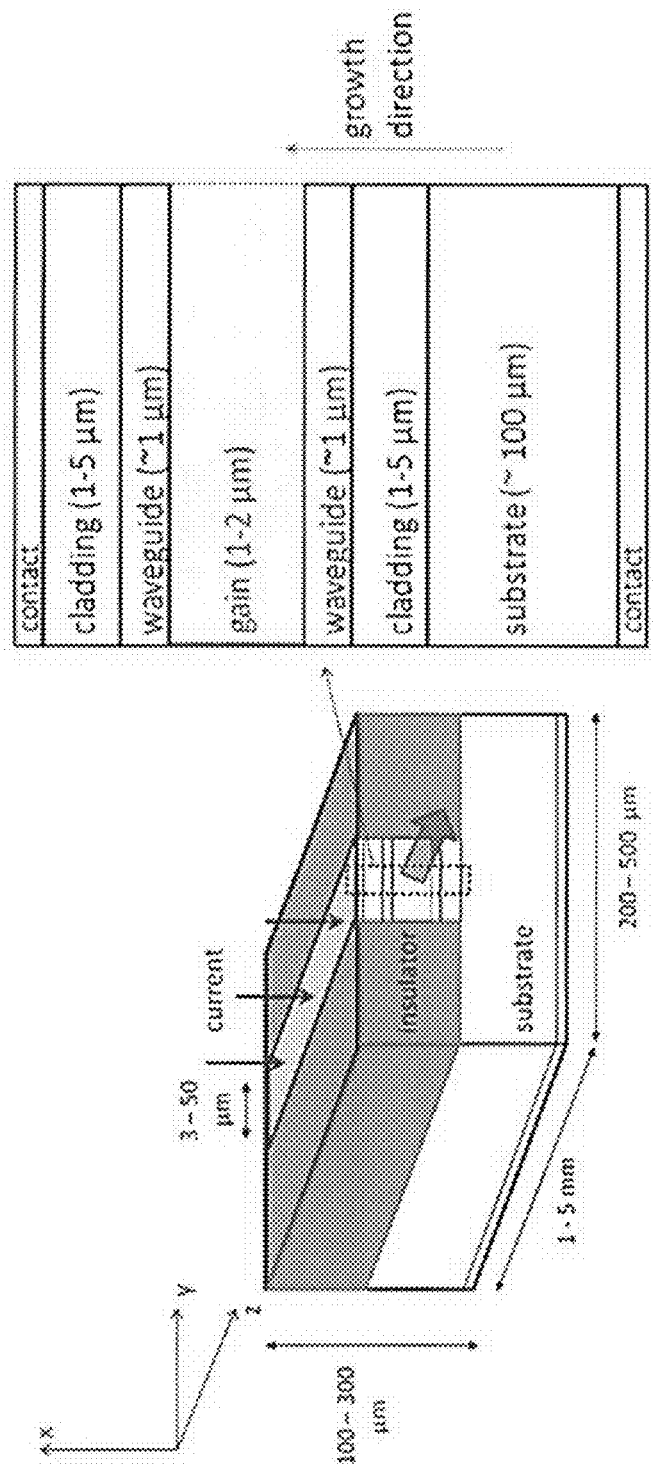
FIG. 1 is a schematic of a buried heterostructure quantum cascade laser showing typical structure and dimensions.
Figure 2:
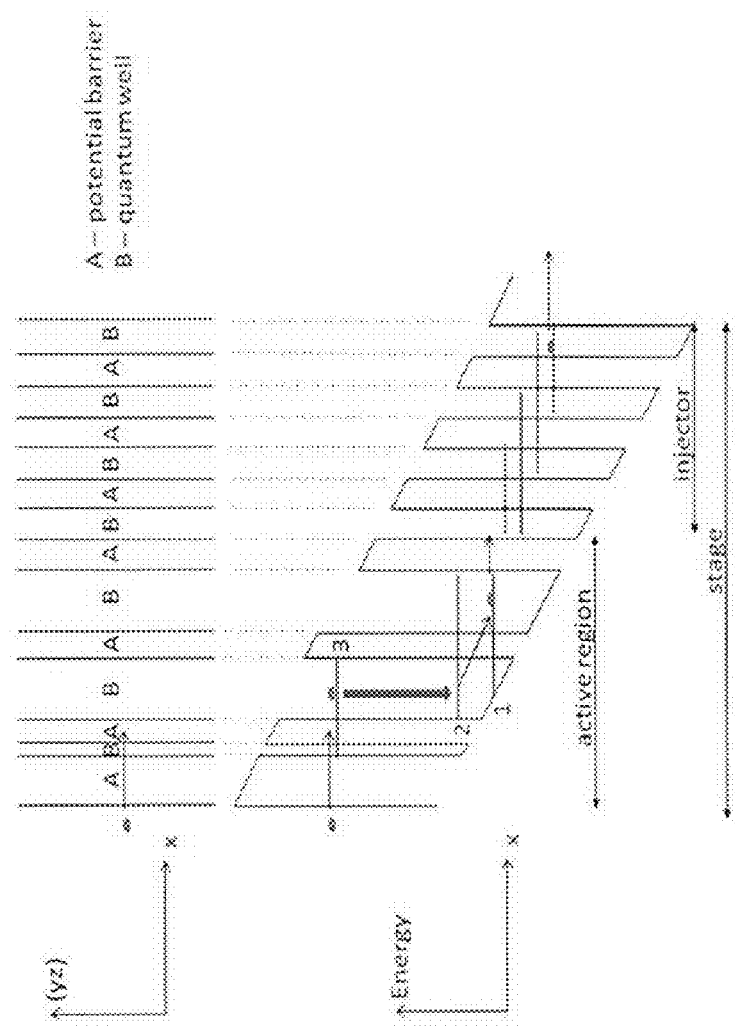
FIG. 2 is a schematic of a single-stage conduction band diagram for a single-phonon resonance design.
Figure 3:
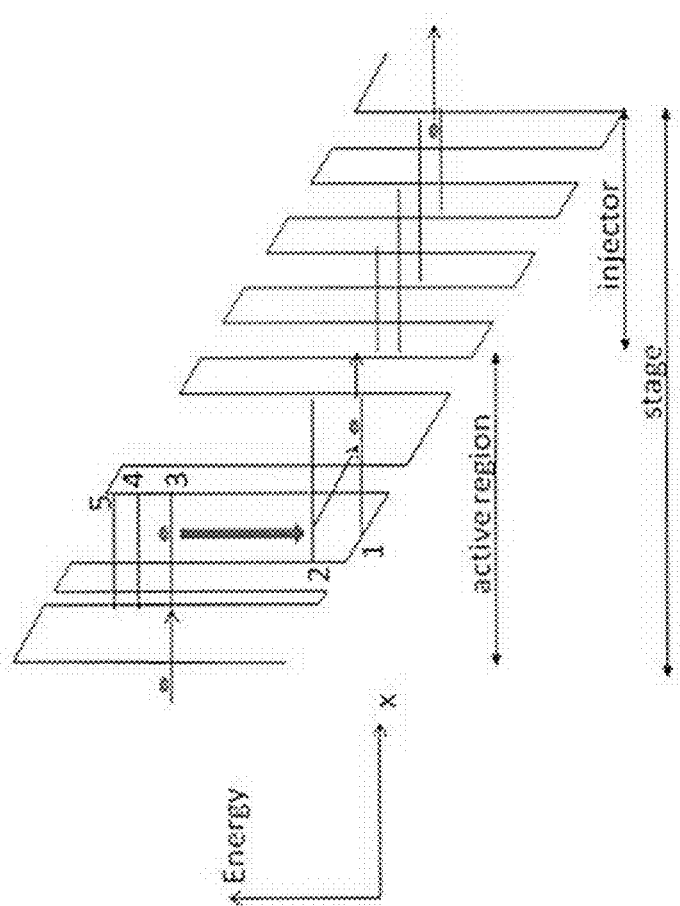
FIG. 3 is a schematic of a single-stage conduction band diagram for a two-phonon resonance design.

The detailed description set forth below in connection with the appended drawings is intended as a description of presently-preferred embodiments of the invention and is not intended to represent the only forms in which the present invention may be constructed or utilized. The description sets forth the functions and the sequence of steps for constructing and operating the invention in connection with the illustrated embodiments. However, it is to be understood that the same or equivalent functions and sequences may be accomplished by different embodiments that are also intended to be encompassed within the spirit and scope of the invention.

As with any other kind of laser, a QCL requires achieving population inversion between the upper and lower lasing states. Since the QCL is a unipolar, non-recombinant device, an important component of achieving population inversion is efficient removal of carriers (electrons in our case) from the lower level.

Traditionally, this efficient removal has been achieved by building a "ladder" of states underneath the lower laser state, where all the levels in the ladder are pairwise separated by one LO phonon energy. The ladder may have only one level under the lower laser level (single phonon design), two lower levels (the classic two phonon resonance design), or more than two lower levels. The basic idea is the same. Separating the levels in the ladder by LO phonon energy makes phonon-assisted electron scattering from level to level resonant, significantly improving scattering rates and thus reducing the lifetime of the lower laser level.

However, this comes at a cost of imposing rigid constraints on the structure design. The requirement of building the precise ladder of states under the lower laser level uses up most of the degrees of freedom available to the designer through varying well and barrier thicknesses, and prevents efficient optimization of the many other active region parameters and mechanisms that the designer would like to optimize.

Consequently, the crux of the present invention is the realization that the LO phonon energy spacing requirement of the ladder can be substantially relaxed without taking a penalty of reduced electron scattering times, and consequently longer lower state lifetime and lower population inversion. The way this is done is by replacing any or all of the previously resonant individual levels in the ladder by two or more closely spaced levels that no longer have to be in phonon resonance with the level above it. (We will use the word "pair" here to describe these closely spaced levels, understanding it also includes a triplet, etc.) Even though scattering rates from the level above the now non-resonant pair to each of the components of the pair are individually lower than for a single resonant level, the total carrier lifetime of the level above the pair is found by summing over all scattering rates (two for a pair, three for a triplet, etc.), and generally comes out comparable to the scattering rate of one resonant level.

In other words, instead of providing one very efficient depopulation path for a given level, the present invention provides several parallel paths that, while individually perhaps not as efficient, together provide depopulation that is as efficient as in the resonant case. Importantly, however, the designer no longer has to satisfy the rigid resonant constraint, which allows freedom to optimize other things in the design.

As a result, the basic NRE design (discussed in detail below) leaves the upper level in the ladder (level 2) resonant with the lower laser level above it (level 3), and replaces the final state 1 with a doublet (levels 1 and 1'). The doublet as a pair is no longer resonant with level 2. In the VTFE design (described below), the final state 1 is replaced by a triplet (levels 1, 1', and 1"). In principle, level 2 could also be replaced by a doublet, triplet, etc.

Figure 5:
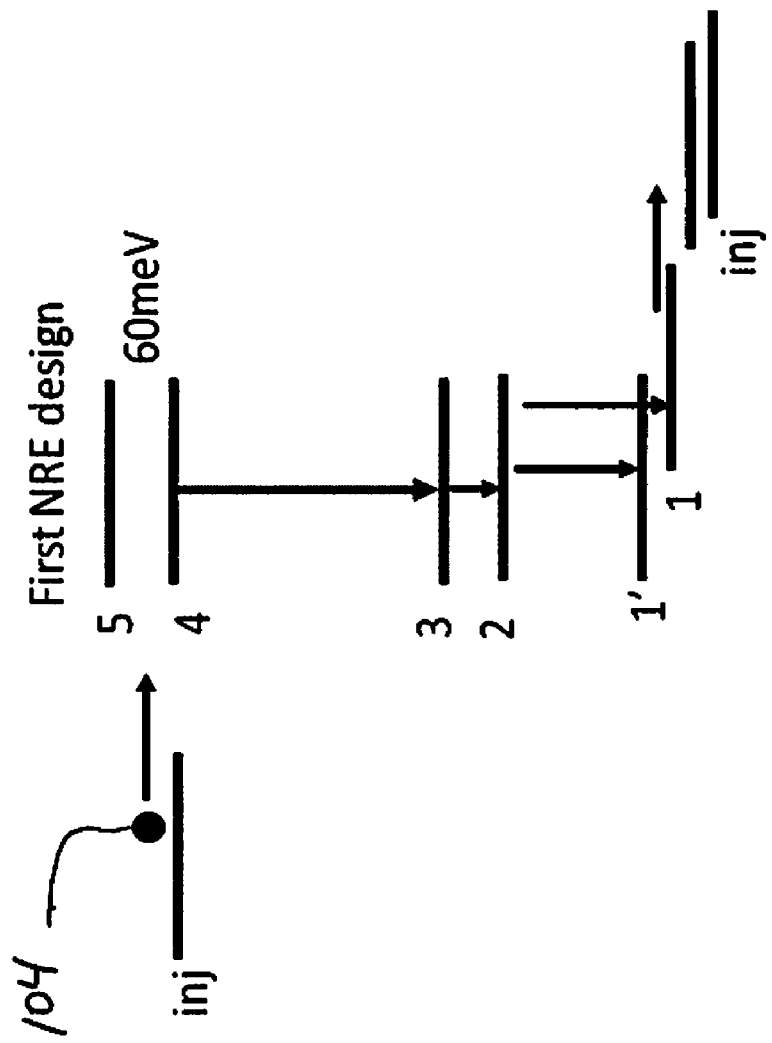
FIG. 5(*a*) is a schematic of the basic NRE design of the present invention.
Figure 5:
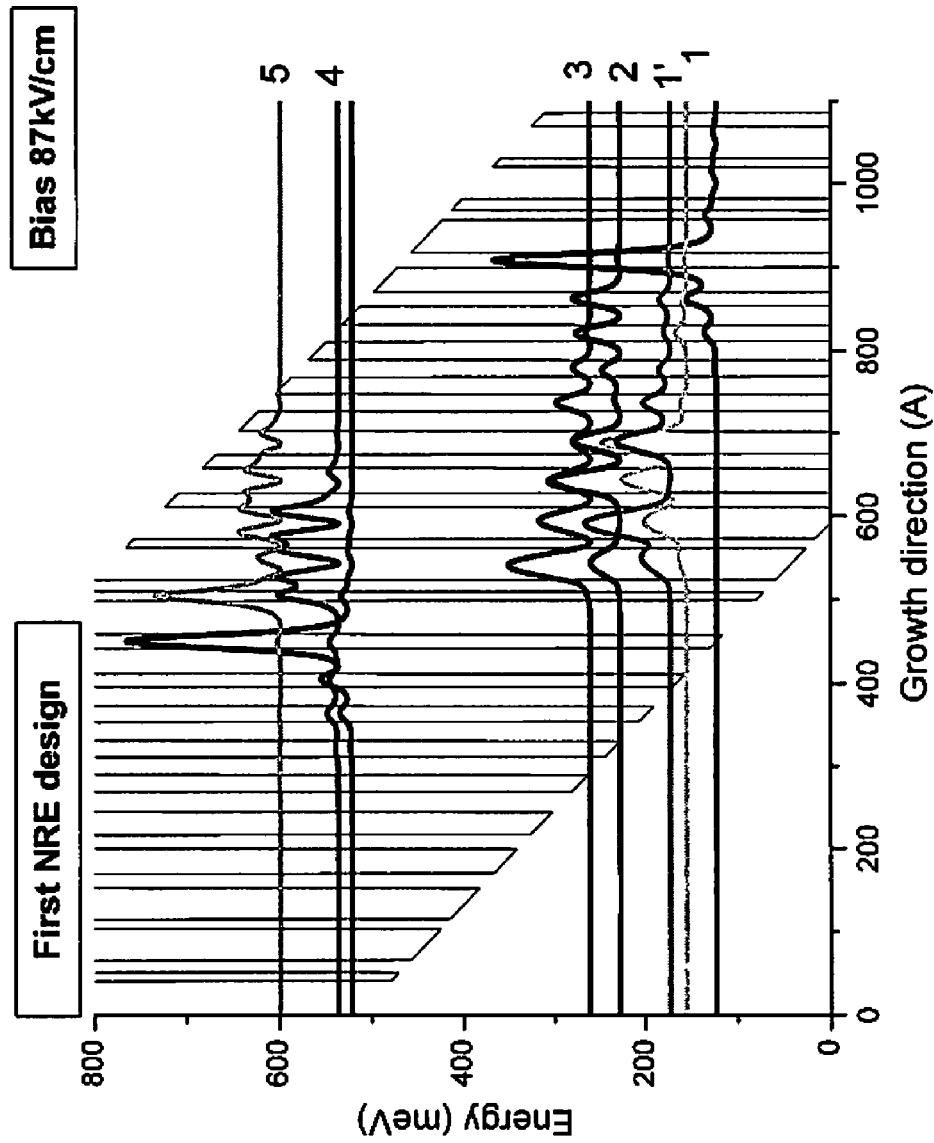

In a first version of the invention, denoted here as the basic non-resonant extraction (NRE) design, a quantum cascade laser 100 has a multilayered semiconductor 102 with a single type of carrier 104; an insulator 106; at least two final levels (designated 1 and 1' in FIGS. 5(a) and 5(b)) for a transition down from level 2. The spacing between the levels 1 and 1' is preferably about 18 meV. This version is depicted schematically in FIGS. 5(a) and 5(b).

The single type of carrier 104 is typically electrons. The energy spacing $E_{21}$ (which is the difference in energy between level 2 and level 1, such as shown in FIGS. 5(a) and 5(b)) is greater than $E_{LO}$ (the energy of the longitudinal optical phonon) and is preferably about 70 meV. This differs from the traditional two-phonon design. The energy spacing $E_{31}$ (the difference in energy between level 3 and level 1, such as shown in FIGS. 5(a) and 5(b)) is about 100 meV to reduce electron thermal backfilling of the lower laser level 3. The energy spacing $E_{32}$ (the difference in energy between level 3 and level 2, such as shown in FIGS. 5(a) and 5(b)) is about equal to $E_{LO}$.

An electric current 110 is injected along an axis perpendicular to the multiple layers, as shown schematically by the x-axis in FIG. 1.

The multilayered semiconductor 102 has a multiple number of gain stages 112. These gain stages 112, in turn, consist of multiple layers with alternating bandgap values 114 (quantum wells and barriers). The insulator 106 confines the electric current 110 under a contact stripe 116 and prevents the electric current 110 from spreading in the axis parallel to the multiple layers (denoted by the y-axis in FIG. 1). The carrier wave function for level 1 overlaps with the carrier wave function for level 2, as indicated in FIG. 5(b). Likewise, the carrier wave function for level 1' overlaps with the carrier wave function for level 2. Refer to FIG. 5(b).

In a version of the invention, the multilayered semiconductor 102 has multiple layers of $In_xGa_{1-x}As/Al_yIn_{1-y}As/InP$ and at least twenty gain stages. Each gain stage has multiple $In_xGa_{1-x}As$ layers with a thickness between about 1 to 5 nanometers and multiple $Al_yIn_{1-y}As$ layers with a thickness between about 1 to 5 nanometers (quantum wells and barriers, respectively).

By way of example, the multilayered semiconductor 102 could have (a) multiple layers of InxGa1-xAs/AlyGa1-yAs/GaAs and a plurality of gain stages, each gain stage having multiple InxGa1-xAs layers and multiple AlyGa1-yAs layers; (b) multiple layers of InxGa1-xAs/AlAsySb1-y/InP and a plurality of gain stages, each gain stage having multiple InxGa1-xAs layers and multiple AlAsySb1-y layers; (c) multiple layers of InAs/AlSb/InAs and a plurality of gain stages, each gain stage having multiple InAs layers and multiple AlSb layers; (d) multiple layers of Si/SiGe/SiGe and a plurality of gain stages, each gain stage having multiple Si layers and multiple SiGe layers; or (e) multiple layers of Si/SiGe/Si and a plurality of gain stages, each gain stage having multiple Si layers and multiple SiGe layers. For each of these examples, there are preferably at least twenty gain stages.

The relatively large value of energy spacing $E_{21}$ does not lead to a longer electron lifetime $\tau_2$ because the inventive design has two, instead of one, closely spaced (at about 18 meV for the described embodiment) lowest active region states 1 and 1', both having large overlaps with state 2.

Figure 6:
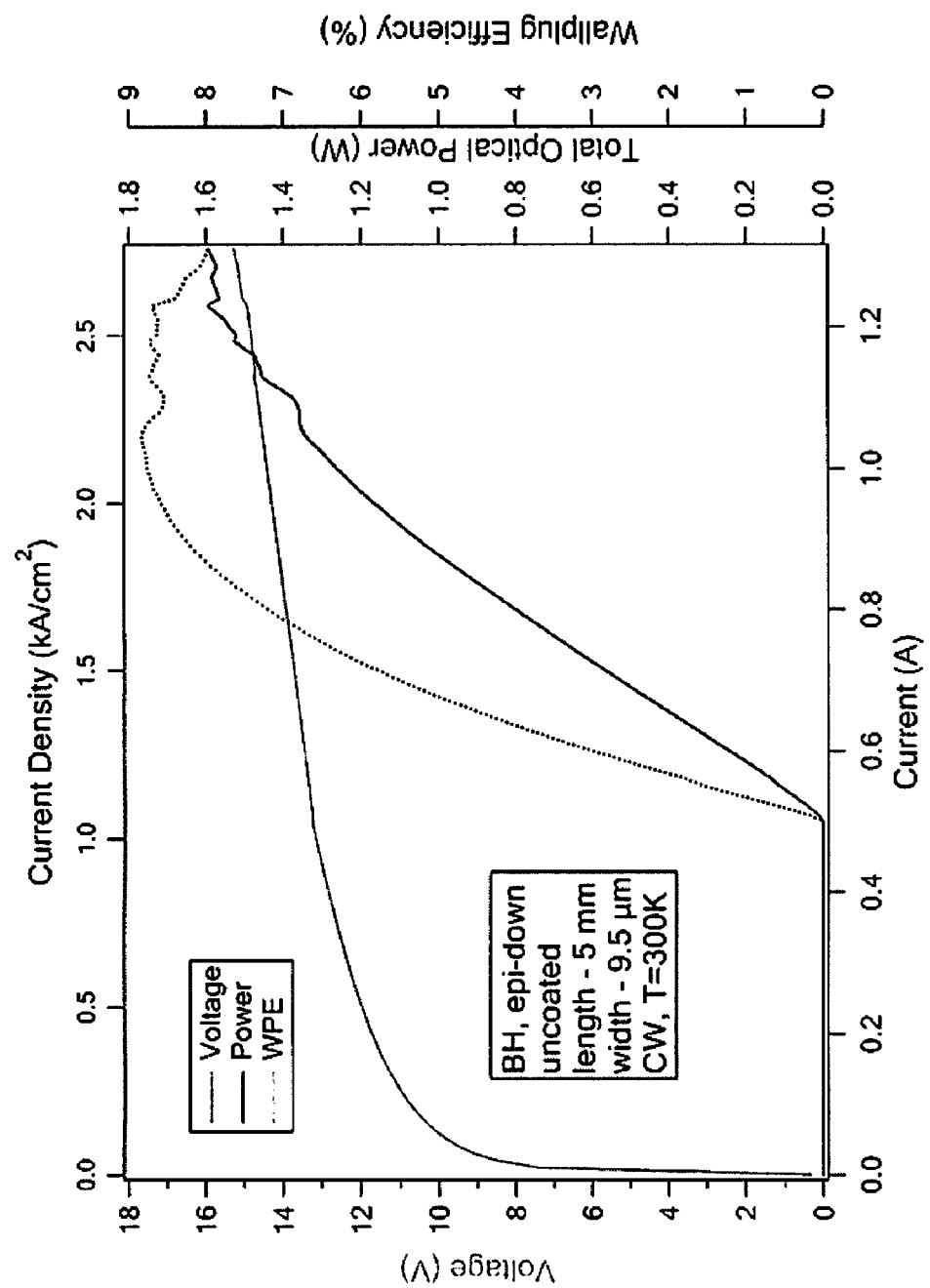
FIG. 6 is a graph showing continuous wave optical power, voltage, and wall plug efficiency vs. current measured at 300K for a 5 mm long, uncoated laser chip with stripe width of 9.5 μm for a quantum cascade laser of the basic NRE version of the present invention.

Continuous wave (CW) optical power and voltage vs. current characteristics for a 5 mm long laser with uncoated facets (having the active region design shown in FIGS. 5(a) and 5(b)) and 9.5 μm stripe width are shown in FIG. 6, along with wall plug efficiency (WPE). The WPE is the total optical power output divided by the electrical power input to the QCL. The maximum total optical power (including both facets) was measured to be 1.6 W at 300K, maximum WPE was found to be 8.8%, and the CW threshold current density was measured to be 1.05 kA/cm².

Figure 7:
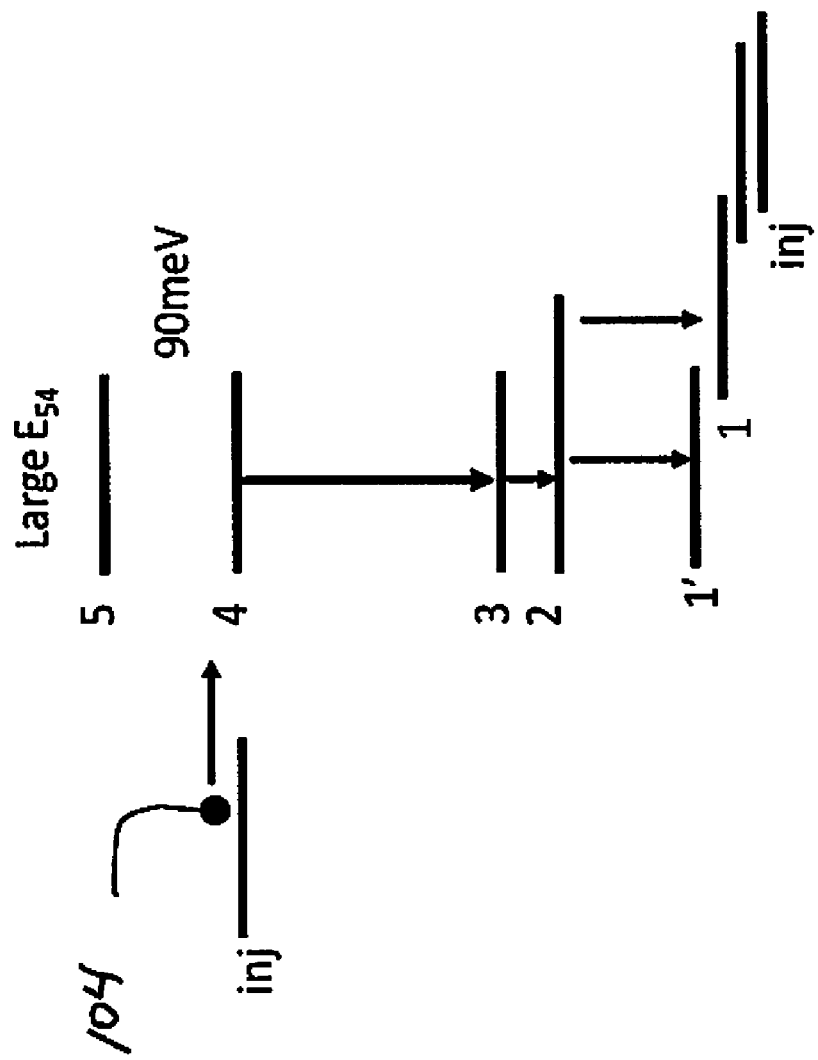
FIG. 7(*a*) is a schematic of a Large $E_{54}$ design version of the present invention.
Figure 7:
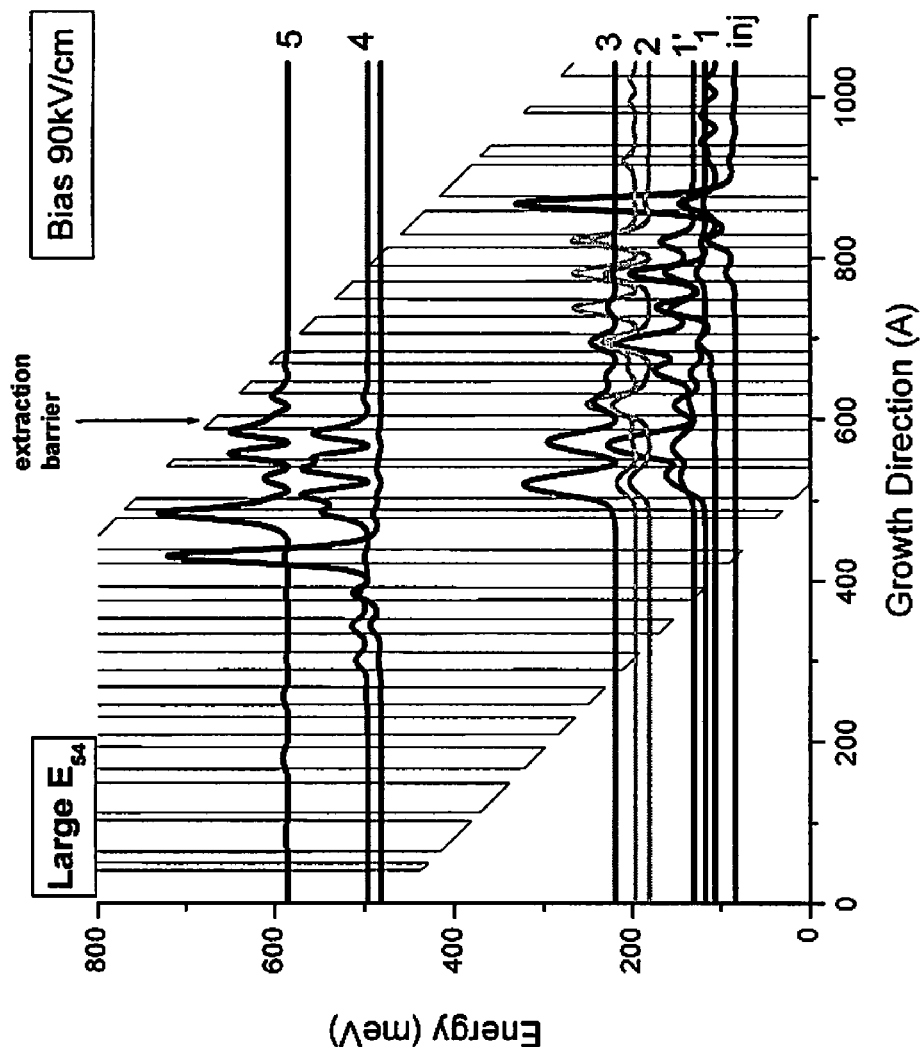

In a second embodiment of the invention, a quantum cascade laser 100 with increased $E_{54}$ spacing is as described above for the basic NRE design and also has an energy spacing $E_{54}$ (which is the difference in energy between level 5 and level 4, such as shown in FIGS. 7(a) and 7(b)) of about 90 meV. The energy spacing $E_{21}$ is preferably about 60 meV. Moreover, the levels 1 and 1' do not have to be spatially close to each other, provided that level 2 has significant overlap with each of these levels. This version is depicted schematically in FIGS. 7(a) and 7(b).

Utilizing the design flexibility of the NRE approach, one can increase the energy spacing $E_{54}$ between the upper laser level 4 and the active region level 5 above it. A larger $E_{54}$ leads to a higher carrier injection efficiency from the lowest injector level to the upper laser level 4 due to suppressed carrier leakage through level 5. The radiative transition from level 4 to level 3 is vertical since levels 4 and 3 are mostly localized in the same two quantum wells. In addition, level 2 has a large overlap both with the active region and injector (also denoted "inj" in the figures), while levels 1 and 1' are localized in the active region and injector, respectively. As a result, levels 1 and 1' do not have to be spatially close to each other, provided that level 2 has significant overlap with both these levels.

In a third broad aspect of the invention, a quantum cascade laser 100 providing vertical transition and fast extraction (VTFE) without delocalization of the states below level 3 is as described above for the basic NRE design but has three final levels (designated as 1, 1', and 1" in FIG. 8(a)) for a transition down from level 2. Additionally, each of the levels 1, 1', and 1" has a non-uniform squared wave function distribution. The levels 1 and 1' are preferably spaced at about 20 meV, and the levels 1' and 1" are preferably spaced at about 18 meV. The energy spacing $E_{21}$ is preferably about 80 meV. This version is depicted schematically in FIGS. 8(a) and 8(b).

Figure 8:
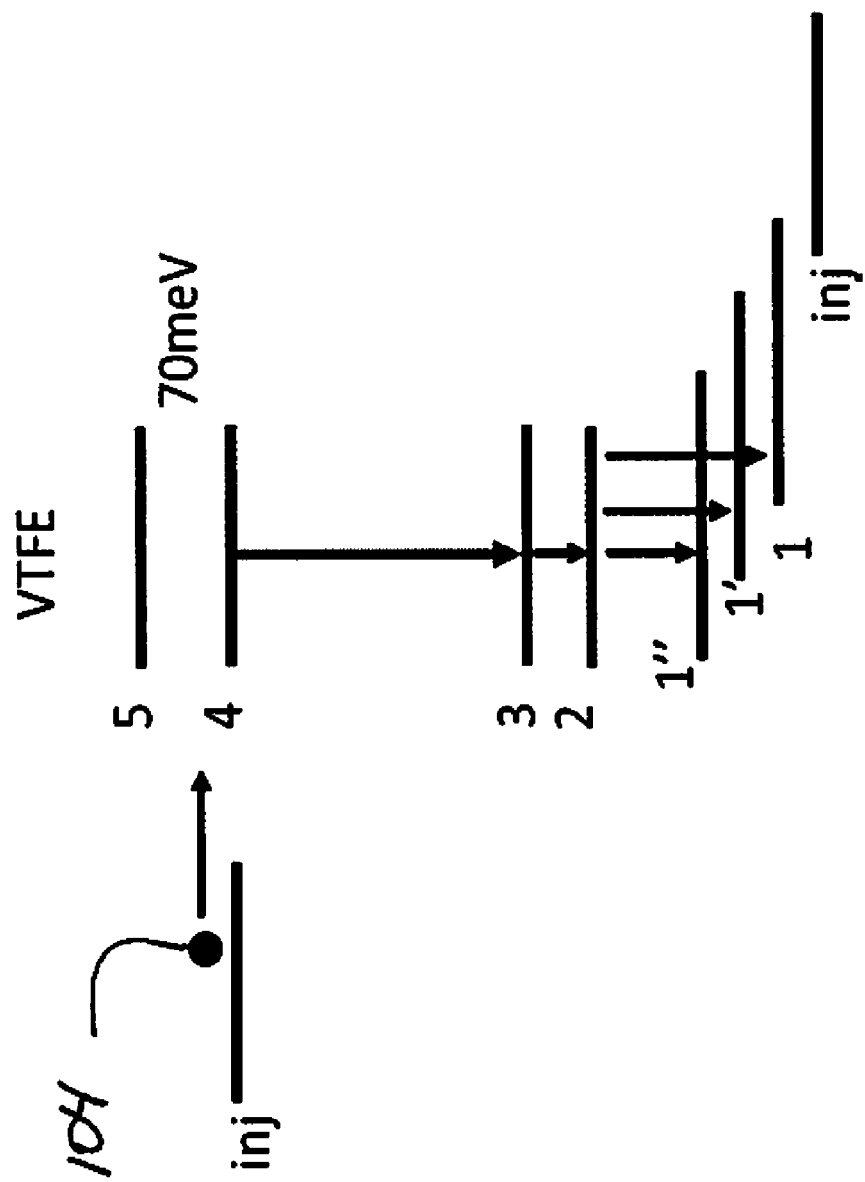
FIG. 8(*a*) is a schematic of a vertical transition and fast extraction (VTFE) design version of the present invention.
Figure 8:
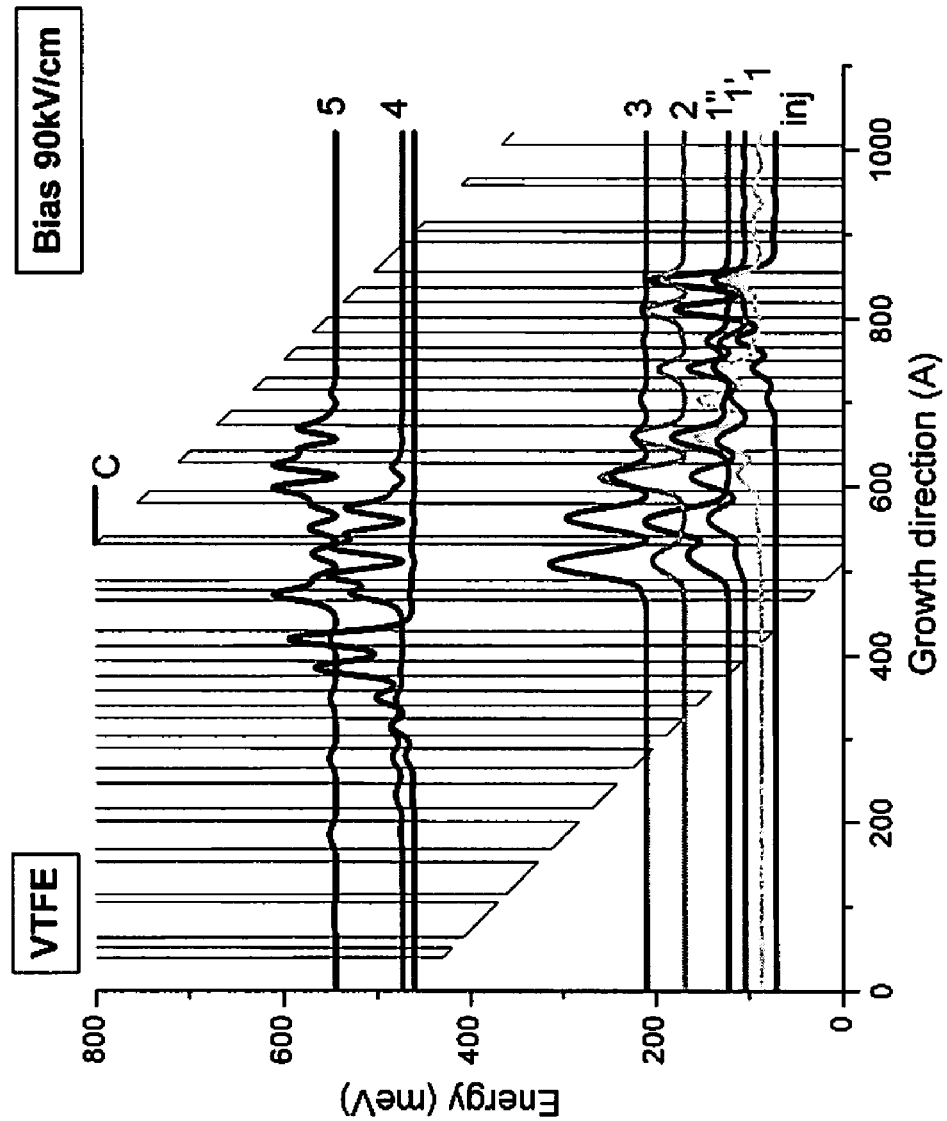

As noted above, vertical laser transition has an advantage of a higher matrix element and lower line width compared to diagonal transition. With the NRE approach, both vertical transition and fast extraction can be achieved without delocalization of the states located below the level 3 (that is, without very strong active region/injector coupling). With reference to FIG. 8(*b*), the laser transition is vertical since the levels 4 and 3 are mostly localized in the same two quantum wells. Energy spacing between the levels 3 and 2 ($E_{32}$) is about equal to LO phonon energy. After the level 3 to level 2 transition, electrons relax from the level 2 through three parallel non-resonant LO phonon transitions to levels designated 1, 1' and 1" in FIG. 8(*a*) and shown between the injector trace and the trace for level 2 in FIG. 8(*b*). As shown in FIG. 8(*b*), levels 1 and 1' have a large overlap both with the active region and injector, and transport for this design is not slowed down by a long active region/injector tunneling time. Moreover, levels 1, 1' and 1" are not delocalized (that is, they do not span through the whole stage with uniformly distributed $\psi^2$). Therefore, vertical laser transition is achieved without restriction of a very strong coupling between the active region and injector, which makes the VTFE design less sensitive to quantum wells/barriers thickness fluctuation.

While the present invention has been described with regards to particular embodiments, it is recognized that additional variations of the present invention may be devised without departing from the inventive concept. For example, the invention may be utilized for other material systems allowing epitaxial fabrication of a sequence of wells and barriers.

INDUSTRIAL APPLICABILITY

This invention may be industrially applied to the development, manufacture, and use of quantum cascade lasers based on non-resonant extraction.

What is claimed is:

1. A quantum cascade laser utilizing non-resonant extraction design, the quantum cascade laser comprising:
   (a) a semiconductor with only one type of carrier, the carrier being electrons, the semiconductor having multiple layers of $In_xGa_{1-x}As/Al_yIn_{1-y}As/InP$ and having at least twenty gain stages, each gain stage comprising multiple $In_xGa_{1-x}As$ layers having a thickness between about 1 to 5 nanometers and multiple $Al_yIn_{1-y}As$ layers having a thickness between about 1 to 5 nanometers, being quantum wells and barriers, respectively, the semiconductor having an active region and an energy relaxation region, the active region having at least four quantum well/barrier pairs;
   (b) an electric current injected along an x-axis perpendicular to the multiple layers;
   (c) an insulator to confine the electric current under a contact stripe and to prevent the electric current from spreading in a y-axis parallel to the multiple layers;
   (d) at least two final levels, denoted here as levels 1 and 1', for a transition down from a level 2, levels 1 and 1' being spaced at about 18 meV, a carrier wave function for level 1 overlapping with a carrier wave function for level 2, a carrier wave function for level 1' overlapping with a carrier wave function for level 2;
   (e) an energy spacing $E_{21}$ greater than $E_{LO}$ and being about 70 mcV;
   (f) an energy spacing $E_{31}$ of about 100 meV;
   (g) an energy spacing $E_{32}$ equal to $E_{LO}$;
   (h) a total optical power greater than 1.5 W at 300K; and
   (i) a wall plug efficiency greater than 8.5%.

2. A quantum cascade laser utilizing non-resonant extraction design, the quantum cascade laser comprising:
   (a) a semiconductor with a single type of carrier, the semiconductor having multiple layers of gain stages, each gain stage comprising multiple layers with alternating bandgap values;
   (b) an electric current injected along an x-axis perpendicular to the multiple layers;
   (c) an insulator to confine the electric current under a contact stripe and to prevent the electric current from spreading in a y-axis parallel to the multiple layers;
   (d) at least two final levels, designated here as 1 and 1', for a transition down from a level 2, levels 1 and 1; a carrier wave function for level 1 overlapping with a carrier wave function for level 2, a carrier wave function for level 1' overlapping with a carrier wave function for level 2;
   (e) an energy spacing $E_{21}$ greater than $E_{LO}$;
   (f) an energy spacing $E_{31}$ of about 100 meV; and
   (g) an energy spacing $E_{32}$ equal to $E_{LO}$.

3. The quantum cascade laser of claim 2, the single type of carrier being electrons.

4. The quantum cascade laser of claim 2, the semiconductor having multiple layers of $In_xGa_{1-x}As/Al_yIn_{1-y}As/InP$ and having at least twenty gain stages, each gain stage comprising multiple $In_xGa_{1-x}As$ layers having a thickness between about 1 to 5 nanometers and multiple $Al_yIn_{1-y}As$ layers having a thickness between about 1 to 5 nanometers, being quantum wells and barriers, respectively.

5. The quantum cascade laser of claim 2, the levels 1 and 1' being spaced at about 18 meV.

6. The quantum cascade laser of claim 2, the energy spacing $E_{21}$ being about 70 mcV.

7. The quantum cascade laser of claim 2, further having a total optical power greater than 1.5 W at 300K.

8. The quantum cascade laser of claim 2, further having a total optical power output and an electrical power input, the product of the total optical power output divided by the electrical power input being greater than 8.5%.

9. The quantum cascade laser of claim 2, the semiconductor having multiple layers of $In_xGa_{1-x}As/Al_yGa_{1-y}As/GaAs$ and having at least twenty gain stages, each gain stage comprising multiple $In_xGa_{1-x}As$ layers and multiple $Al_yGa_{1-y}As$ layers.

10. The quantum cascade laser of claim 2, the semiconductor having multiple layers of $In_xGa_{1-x}As/AlAs_ySb_{1-y}/InP$ and having at least twenty gain stages, each gain stage comprising multiple $In_xGa_{1-x}As$ layers and multiple $AlAs_ySb_{1-y}$ layers.

11. The quantum cascade laser of claim 2, the semiconductor having multiple layers of InAs/AlSb/InAs and having at least twenty gain stages, each gain stage comprising multiple InAs layers and multiple AlSb layers.

12. The quantum cascade laser of claim 2, the semiconductor having multiple layers of Si/SiGe/SiGe and having at least twenty gain stages, each gain stage comprising multiple Si layers and multiple SiGe layers.

13. The quantum cascade laser of claim 2, the semiconductor having multiple layers of Si/SiGe/Si and having at least twenty gain stages, each gain stage comprising multiple Si layers and multiple SiGe layers.

14. A quantum cascade laser utilizing non-resonant extraction design and with increased $E_{54}$ spacing, the quantum cascade laser comprising:
   (a) a semiconductor with a single type of carrier, the semiconductor having multiple layers of gain stages, each gain stage comprising multiple layers with alternating bandgap values;

(b) an electric current injected along an x-axis perpendicular to the multiple layers;
(c) an insulator to confine the electric current under a contact stripe and to prevent the electric current from spreading in a y-axis parallel to the multiple layers;
(d) at least two final levels, here denoted 1 and 1', for a transition down from a level 2, levels 1 and 1', a carrier wave function for level 1 overlapping with a carrier wave function for level 2, a carrier wave function for level 1' overlapping with a carrier wave function for level 2;
(e) an energy spacing $E_{21}$ greater than $E_{LO}$;
(f) an energy spacing $E_{31}$ of about 100 meV;
(g) an energy spacing $E_{32}$ equal to $E_{LO}$; and
(h) an energy spacing $E_{54}$ of about 90 meV.

15. The quantum cascade laser of claim 14, the single type of carrier being electrons.

16. The quantum cascade laser of claim 14, the semiconductor having multiple layers of $In_xGa_{1-x}As/Al_yIn_{1-y}As/InP$ and having at least twenty gain stages, each gain stage comprising multiple $In_xGa_{1-x}As$ layers having a thickness between about 1 to 5 nanometers and multiple $Al_yIn_{1-y}As$ layers having a thickness between about 1 to 5 nanometers, being quantum wells and barriers, respectively.

17. The quantum cascade laser of claim 14, the energy spacing $E_{21}$ being about 60 mcV.

18. The quantum cascade laser of claim 14, wherein the laser has a total optical power greater than 2.0 W at 300K.

19. A quantum cascade laser utilizing non-resonant extraction design and providing vertical transition and fast extraction without delocalization of the states below a level 3, the quantum cascade laser comprising:
(a) a semiconductor with a single type of carrier, the semiconductor having multiple layers of gain stages, each gain stage comprising multiple layers with alternating bandgap values;
(b) an electric current injected along an x-axis perpendicular to the multiple layers;
(c) an insulator to confine the electric current under a contact stripe and to prevent the electric current from spreading in a y-axis parallel to the multiple layers;
(d) three final levels, denoted here as 1, 1', and 1", for a transition down from a level 2, levels 1 and 1', each or the levels 1, 1', and 1" having a non-uniform squared wave function distribution;
(e) an energy spacing $E_{21}$ greater than $E_{LO}$;
(f) an energy spacing $E_{31}$ of about 100 meV; and
(g) an energy spacing $E_{32}$ equal to $E_{LO}$.

20. The quantum cascade laser of claim 19, the single type of carrier being electrons.

21. The quantum cascade laser of claim 19, the semiconductor having multiple layers of $In_xGa_{1-x}As/Al_yIn_{1-y}As/InP$ and having at least twenty gain stages, each gain stage comprising multiple $In_xGa_{1-x}As$ layers having a thickness between about 1 to 5 nanometers and multiple $Al_yIn_{1-y}As$ layers having a thickness between about 1 to 5 nanometers, being quantum wells and barriers, respectively.

22. The quantum cascade laser of claim 19, the levels 1 and 1' being spaced at about 20 meV, and the levels 1' and 1" being spaced at about 18 meV.

23. The quantum cascade laser of claim 19, the energy spacing $E_{21}$ being about 80 meV.

24. The quantum cascade laser of claim 19, further having a total optical power greater than 1.5 W at 300K.

25. The quantum cascade laser of claim 19, further having a wall plug efficiency greater than 8.5%.

\* \* \* \* \*

UNITED STATES PATENT AND TRADEMARK OFFICE
CERTIFICATE OF CORRECTION

PATENT NO. : 8,014,430 B2  
APPLICATION NO. : 12/395576  
DATED : September 6, 2011  
INVENTOR(S) : Arkadiy Lyakh et al.

Page 1 of 1

It is certified that error appears in the above-identified patent and that said Letters Patent is hereby corrected as shown below:

On the Title Page,  
Item (73) The Assignee section shall read:

Assignees: Pranalytica, Inc., Santa Monica, CA (US) and  
President and Fellows of Harvard College, Cambridge, MA (US)

Item (75) The Inventors section shall read:

Inventors: Arkadiy Lyakh, Los Angeles, CA (US)  
Richard Maulini, Los Angeles, CA (US)  
Alexei Tsekoun, Los Angeles, CA (US)  
C. Kumar N. Patel, Los Angeles, CA (US)  
Christian Pflugl, Cambridge, MA (US)  
Laurent Diehl, Cambridge, MA (US)  
Qijie Wang, Cambridge, MA (US)  
Federico Capasso, Cambridge, MA (US)

Signed and Sealed this  
Thirteenth Day of March, 2012

David J. Kappos  
*Director of the United States Patent and Trademark Office*